US009389621B2

(12) United States Patent
Lee et al.

(10) Patent No.: US 9,389,621 B2
(45) Date of Patent: Jul. 12, 2016

(54) COMPENSATION CIRCUIT FOR COMMON VOLTAGE ACCORDING TO GATE VOLTAGE

(71) Applicant: LG DISPLAY CO., LTD., Seoul (KR)

(72) Inventors: Kyung-Woo Lee, Goyang-si (KR); Jae-Hun Song, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/574,685

(22) Filed: Dec. 18, 2014

(65) Prior Publication Data

US 2015/0185744 A1 Jul. 2, 2015

(30) Foreign Application Priority Data

Dec. 30, 2013 (KR) ........................ 10-2013-0167586

(51) Int. Cl.
*H03F 3/45* (2006.01)
*G05F 1/46* (2006.01)
*G09G 3/36* (2006.01)

(52) U.S. Cl.
CPC .............. *G05F 1/461* (2013.01); *G09G 3/3655* (2013.01); *G09G 2320/0247* (2013.01); *G09G 2320/0276* (2013.01); *G09G 2320/041* (2013.01); *G09G 2330/12* (2013.01)

(58) Field of Classification Search
CPC ........................................................ H03F 3/45
USPC .................................................... 330/69, 260
See application file for complete search history.

(56) References Cited

U.S. PATENT DOCUMENTS

| | | | | | |
|---|---|---|---|---|---|
| 3,757,241 | A | * | 9/1973 | Kime et al. | 330/261 |
| 4,260,954 | A | * | 4/1981 | Crooks | 330/85 |
| 4,979,218 | A | * | 12/1990 | Strahm | 381/94.6 |
| 5,327,101 | A | * | 7/1994 | Neely et al. | 330/284 |
| 5,427,111 | A | * | 6/1995 | Traub et al. | 600/508 |

* cited by examiner

*Primary Examiner* — Henry Choe
(74) *Attorney, Agent, or Firm* — Dentons US LLP

(57) ABSTRACT

Disclosed is a compensation circuit for a common voltage according to a gate voltage, which compensates the common voltage in accordance with variation in gate high voltage, to obtain an optimal common voltage. The compensation circuit includes a divider to divide a gate high voltage, an adder to add a fed-back common voltage to a voltage output from the divider, and a differential amplifier to differentially amplify a voltage output from the adder, and to output the amplified voltage as a compensated common voltage.

2 Claims, 4 Drawing Sheets

COMPENSATION CIRCUIT FOR COMMON VOLTAGE ACCORDING TO GATE VOLTAGE

This application claims the benefit of the Korean Patent Application No. 10-2013-0167586, filed on Dec. 30, 2013, which is hereby incorporated by reference for all purposes as if fully set forth herein.

BACKGROUND OF THE INVENTION

1. Field of the Invention

The present invention relates to a liquid crystal display device. More particularly, the present invention relates to a compensation circuit for a common voltage according to a gate voltage, which compensates the common voltage in accordance with variation in a gate high voltage, to obtain an optimal common voltage.

2. Discussion of the Related Art

With the recent progress of an information-dependent society, the field of displays to visually express electric information signals has rapidly developed. As a result, various flat display devices having superior characteristics such as lightness, thinness, and low power consumption have been developed to rapidly replace for cathode ray tubes (CRTs).

Examples of flat display devices include a liquid crystal display device (LCD), a plasma display panel device (PDP), a field emission display devices (FED), an electro luminescent display device (ELD) and the like. These flat display devices commonly include, as an essential constituent element thereof, a flat display panel to realize an image. The flat display panel has a structure in which two transparent insulating substrates are assembled to face each other under the condition that an inherent luminous or polarizing material layer is interposed between the substrates.

Among flat display devices, the liquid crystal display device displays an image through control of light transmittance of liquid crystals using an electric field. The liquid crystal display device has been highlighted as a next generation display device with high value-added advantages with respect to notebook computers and large-screen TVs because of low power consumption, slimness, and large screen size thereof. Such a liquid crystal display device includes a liquid crystal panel having liquid crystal cells, a backlight unit to irradiate light to the liquid crystal panel and a drive circuit to drive the backlight unit and liquid crystal cells.

Hereinafter, a related art liquid crystal display device will be described with reference to the accompanying drawings.

FIG. 1 is a block diagram illustrating a configuration of a related art liquid crystal display device.

As illustrated in FIG. 1, the liquid crystal display device includes a liquid crystal panel 10 to display an image. The liquid crystal panel 10 includes a plurality of gate lines GL, a plurality of data lines DL, and thin film transistors T arranged in the form of a matrix at crossings of the gate lines GL and data lines DL. The liquid crystal display device also includes a gate driver 30 to sequentially supply gate signals to respective gate lines GL of the liquid crystal panel 10, a data driver 50 to supply a data signal to the data lines DL of the liquid crystal panel 10, a timing controller 20 to receive control signals from an external source along with the data signal, and to control the gate driver 30 and data driver 50 in accordance with the received signals, a gamma circuit 60 to supply a gamma voltage to the data driver 50, and a common voltage circuit 70 to supply a common voltage Vcom to a common electrode (not shown) of the liquid crystal panel 10.

In particular, when the liquid crystal panel 10 is of a twisted nematic (TN) mode type, the liquid crystal panel 10 has a structure in which a first substrate and a second substrate are assembled under the condition that a liquid crystal layer is interposed between the first substrate and the second substrate. In this case, an image is displayed through control of light transmittance of liquid crystals according to intensity of an electric field established due to a voltage difference between the two substrates. A grayscale voltage corresponding to an image signal is applied to one of the two substrates, and the common voltage Vcom is applied to the other substrate, to establish an electric field due to a voltage difference between the grayscale voltage and the common voltage, and, as such, light transmittance of the liquid crystals is controlled.

When the liquid crystal panel 10 is of an in-plane switching (IPS) mode type in which both the image signal and the common voltage Vcom are applied to one substrate, the liquid crystal panel 10 has the same driving principle as the TN mode type, except for the electrode structure.

Hereinafter, operation of the related art liquid crystal display device will be described.

First, when control signals from the outside are supplied to the timing controller 20, the timing controller 20 generates a gate control signal to drive the gate driver 30 and a data control signal to drive the data driver 50 in response to the control signals, and supplies the gate control signal and data control signal to the gate driver 30 and data driver 50, respectively. When the timing controller 20 receives a data signal from an external source, the timing controller 20 rearranges the data signal, and supplies the resultant signal to the data driver 50.

Upon receiving the gate control signal, the gate driver 30 sequentially supplies gate drive signals to the liquid crystal panel 10 through respective gate lines GL on a per horizontal line basis for one frame.

Upon receiving the data control signal, the data driver 50 converts the digital data signal into an analog image signal, and simultaneously supplies the analog image signal to all data lines DL of the liquid crystal panel 10 on a per horizontal line basis.

In addition, the common voltage circuit 70 generates the common voltage Vcom, and supplies the common voltage Vcom to the common electrode of the liquid crystal panel 10.

Thus, the liquid crystal panel 10 displays grayscales of an image according to a voltage difference between the image signal supplied from the data driver 50 and the common voltage Vcom. For this reason, image quality is greatly influenced by the value of the common voltage Vcom.

FIG. 2 is a block diagram illustrating a configuration of a related art common voltage circuit.

As illustrated in FIG. 2, the related art common voltage circuit 70 includes an n-bit register 71 to receive input data SDA and an external clock signal, an n-bit memory 73 to store the input data SDA, a controller to control the n-bit memory 73, and a decoder 77 to convert binary data input from the n-bit register 71 into a selection signal. The common voltage circuit 70 also includes a plurality of resistors R1 to Rm to divide first and second input voltages VH and VL, and a switching unit 78 to output one of different voltages having m levels, which are obtained in accordance with voltage division by the resistors R1 to Rm.

An operator supplies an image signal for testing to the liquid crystal panel, to display an image on the liquid crystal panel, and then inputs an appropriate temporary common voltage to the common voltage circuit 70, to inspect the displayed image. Through inspection, the operator finds an optimal common voltage FVcom to minimize flicker.

In accordance with another method, the common voltage output from the common voltage circuit 70 is fed back, and a difference between the fed-back common voltage and a voltage from a variable resistor is amplified using the variable resistor and, as such, an optimal common voltage is found.

Meanwhile, a circuit to increase a gate high voltage VGH in a low temperature environment is configured, using a thermistor, in order to compensate for degradation of gate in panel (GIP) characteristics in a low temperature environment.

FIG. 3 is a diagram illustrating a gate high voltage output circuit in the related art liquid crystal display device. FIG. 4 is a graph depicting a variation in gate high voltage according to a temperature variation measured by a thermistor in the related art liquid crystal display device.

As illustrated in FIG. 3, the related art liquid crystal display device uses a variable circuit in which a gate high voltage VGH output from the liquid crystal display device is set to be varied from a voltage VFB to a voltage VRUTC, using a thermistor TH, when a resistance is increased at a low temperature and, as such, a gate high voltage VGH is increased when the voltage VRUTC increases.

That is, the thermistor TH senses ambient temperature and, as such, the resistance of the thermistor TH is increased when ambient temperature is low. An output signal from the thermistor TH is applied to a power IC P-IC. The power IC P-IC utilizes a variable circuit in which the voltage VRUTC is output, in place of the voltage VFB, when the detect signal from the thermistor TH represents low temperature, and the gate high voltage VGH is increased when the voltage VRUTC increases.

For example, FIG. 4 explains an example in which 34V is output as a gate high voltage when ambient temperature is lower than 0° C., and the gate high voltage is gradually lowered in accordance with an increase in ambient temperature when ambient temperature ranges between 0° C. and 10° C., and, as such, 29V is output as the gate high voltage when ambient temperature is higher than 10° C.

However, variation of gate high voltage in the related art case encounters the following problems.

That is, when the gate high voltage is increased in a low temperature, using the thermistor, the optimal common voltage may be varied and, as such, the optimal common voltage at low temperature may differ from the common voltage set at normal temperature.

The difference between the optimal common voltage at low temperature and the common voltage set at normal temperature may cause frame rate control (ERC) noise.

In addition, in the case in which a gate high voltage is generated, using a pumping circuit, the gate high voltage may have a ripple component, in particular, in a liquid crystal display device model exhibiting high load of the liquid crystal panel thereof, as in a double rate driving system. As a result, the common voltage in the panel is lowered.

SUMMARY OF THE INVENTION

Accordingly, the present invention is directed to a compensation circuit for a common voltage according to a gate voltage that substantially obviates one or more problems due to limitations and disadvantages of the related art.

An advantage of the present invention is to provide a compensation circuit for a common voltage according to a gate voltage, which is capable of minimizing variation in common voltage caused by compensation of a gate high voltage according to variation in temperature, thereby preventing degradation of picture quality caused by variation in common voltage.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these other advantages and in accordance with the purpose of the invention, as embodied and broadly described herein, a compensation circuit for a common voltage according to a gate voltage includes a divider to divide a gate high voltage, an adder to add a fed-back common voltage to a voltage output from the divider, and a differential amplifier to differentially amplify a voltage output from the adder, and to output the amplified voltage as a compensated common voltage.

The voltage output from the adder may be input to an inverting terminal (−) of the differential amplifier, and a voltage from a variable resistor may be applied to a non-inverting terminal (+) of the differential amplifier.

The common voltage compensation circuit according to the present invention having the above-described features has the following effects.

That is, when the gate high voltage is varied in accordance with a variation in ambient temperature, an optimal common voltage is varied in accordance with the gate high voltage variation. Accordingly, it may be possible not only to prevent generation of noise caused by a difference between an optimal common voltage at low temperature and a common voltage set at normal temperature, but also to avoid ripple in the gate high voltage, differently than the conventional case. Thus, an improvement in picture quality may be achieved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the embodiments of the present invention, examples of which are illustrated in the accompanying drawings.

Figure 5:
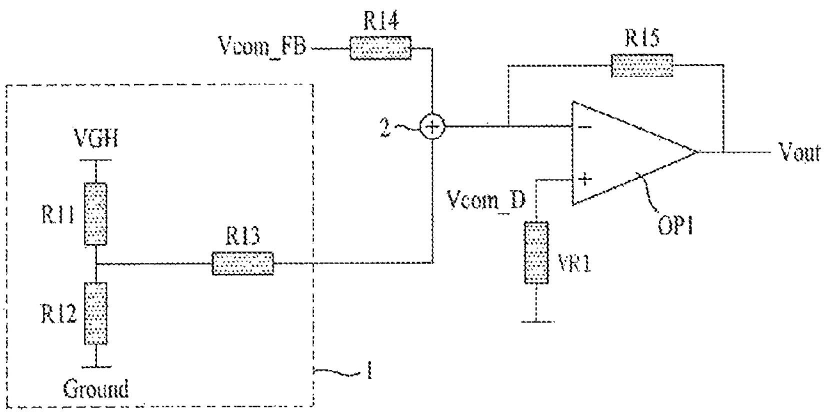
FIG. 5 is a diagram illustrating a circuit for compensating a common voltage depending on a gate voltage in accordance with the present invention.

FIG. 5 is a diagram illustrating a circuit for compensating a common voltage depending on a gate voltage in accordance with the present invention.

Figure 1:
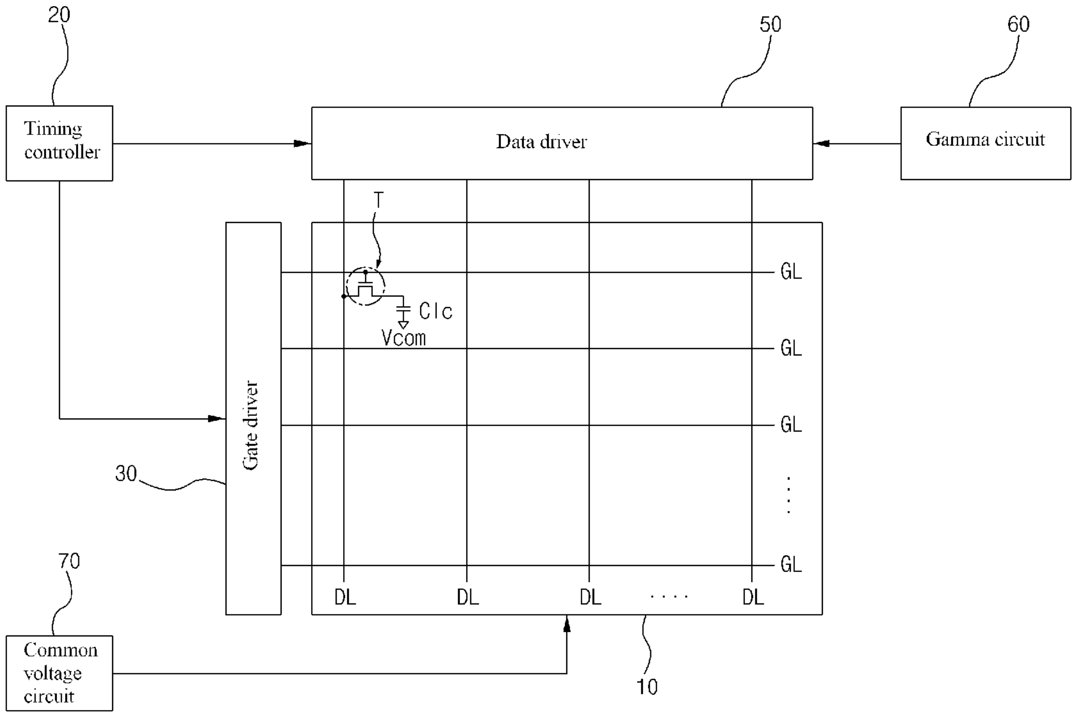
FIG. 1 Related art
FIG. 1 is a block diagram schematically illustrating a configuration of a related art liquid crystal display device.
Figure 2:
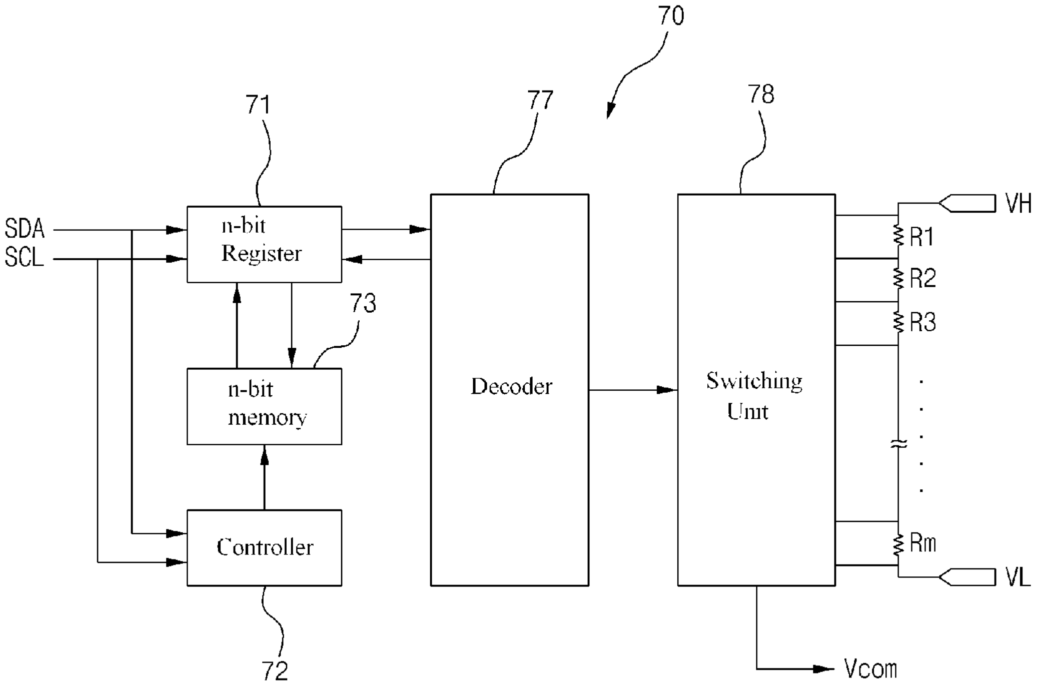
FIG. 2 Related art
FIG. 2 is a block diagram illustrating a configuration of a related art common voltage circuit.
Figure 3:
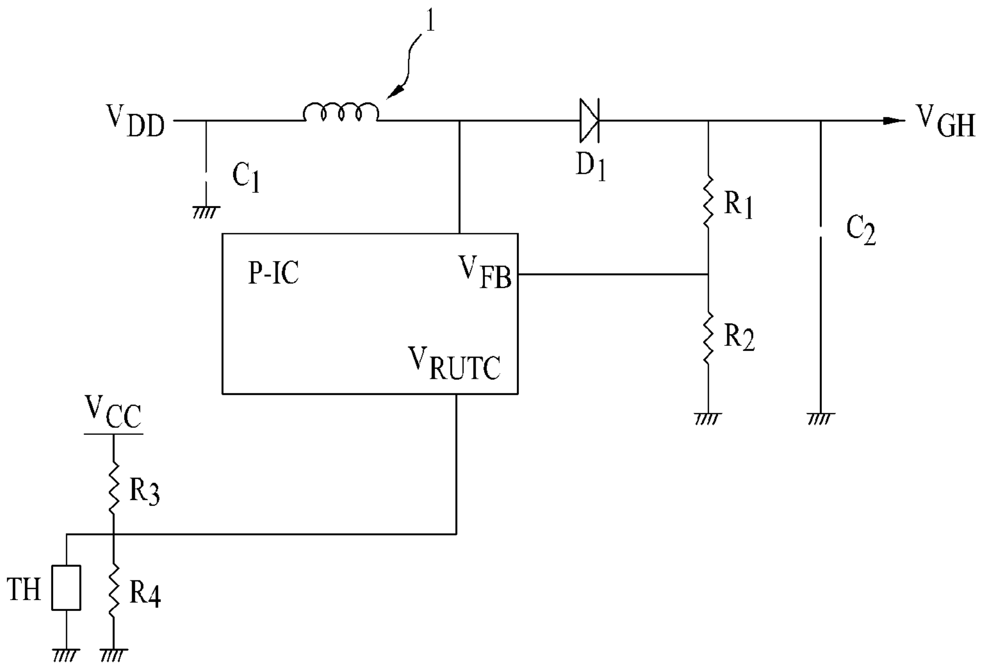
FIG. 3 Related art
FIG. 3 is a diagram illustrating a gate high voltage output circuit in the related art liquid crystal display device.
Figure 4:
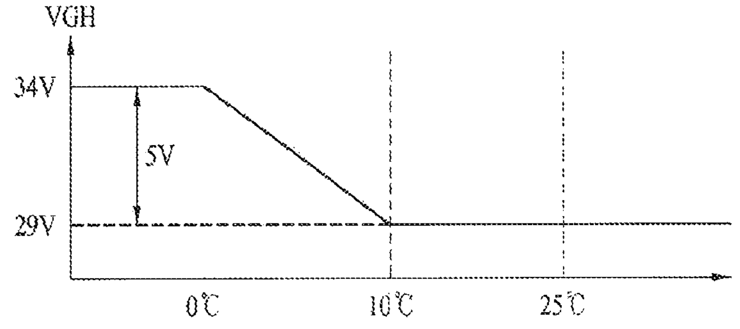
FIG. 4 Related art
FIG. 4 is a graph depicting a variation in gate high voltage according to a temperature variation measured by a thermistor in the related art liquid crystal display device.

As illustrated in FIG. 5, the compensation circuit includes a divider 1 including a plurality of resistors, for example, resistors R11 and R12, to divide a gate high voltage VGH, an adder 2 to feed back a common voltage output from a common voltage circuit (not shown) (cf. FIG. 2), and to add the fed-back common voltage, namely, a voltage Vcom_FB, to a voltage output from the divider 1, and a differential amplifier OP1 to amplify a difference between a voltage output from the adder 2 and a voltage Vcom_D output from a variable resistor, thereby outputting a compensated common voltage.

In this case, the voltage output from the adder 2 is input to an inverting terminal (−) of the differential amplifier OP1, and the voltage Vcom_D output from the variable resistor is input to a non-inverting terminal (+) of the differential amplifier OP1.

Hereinafter, an operation of the circuit for compensating a common voltage depending on a gate voltage in accordance with the present invention, which is configured as described above, will be described.

As described in conjunction with the related art case, when the gate high voltage VGH is increased in a low temperature environment, using a thermistor, in order to compensate for degradation of gate in panel (GIP) characteristics in a low temperature environment, an output voltage from the divider 1 is increased.

In addition, an output from the adder 2, which adds the fed-back common voltage Vcom_FB to the voltage output from the divider 1, is increased. Accordingly, the differential amplifier OP1 outputs a common voltage compensated in accordance with the gate high voltage.

As apparent from the above description, when the gate high voltage is varied in accordance with variation in ambient temperature, an optimal common voltage is varied in accordance with the gate high voltage variation. Accordingly, it may be possible not only to prevent generation of noise caused by a difference between an optimal common voltage at low temperature and a common voltage set at normal temperature, but also to avoid ripple in the gate high voltage, differently than the conventional case. Thus, an improvement in picture quality may be achieved.

It will be apparent to those skilled in the art that various modifications and variations can be made in the present invention without departing from the spirit or scope of the inventions. Thus, it is intended that the present invention cover the modifications and variations of this invention provided they come within the scope of the appended claims and their equivalents.

What is claimed is:

1. A compensation circuit for a common voltage, comprising:

a divider to divide a gate high voltage, wherein the gate high voltage is varied in accordance with an ambient temperature, wherein the gate high voltage is increased at a low temperature and decreased at a high temperature;

an adder to add a feed-back common voltage supplied directly from a common voltage circuit and a voltage output from the divider; and a differential amplifier to differentially amplify a voltage output from the adder and a voltage from a variable resistor, wherein a voltage output from the differential amplifier is a compensated common voltage based upon the varied gate high voltage.

2. The compensation circuit according to claim 1, wherein the voltage output from the adder is input to an inverting terminal (−) of the differential amplifier, and the voltage from the variable resistor is applied to a non-inverting terminal (+) of the differential amplifier.

* * * * *